United States Patent
Cea et al.

(10) Patent No.: US 9,905,650 B2
(45) Date of Patent: *Feb. 27, 2018

(54) UNIAXIALLY STRAINED NANOWIRE STRUCTURE

(71) Applicant: Intel Corporation, Santa Clara, CA (US)

(72) Inventors: Stephen M. Cea, Hillsboro, OR (US); Seiyon Kim, Portland, OR (US); Annalisa Cappellani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/339,620

(22) Filed: Oct. 31, 2016

(65) Prior Publication Data
US 2017/0047405 A1 Feb. 16, 2017

Related U.S. Application Data

(63) Continuation of application No. 14/948,039, filed on Nov. 20, 2015, now Pat. No. 9,490,320, which is a
(Continued)

(51) Int. Cl.
*H01L 27/12* (2006.01)
*H01L 29/10* (2006.01)
(Continued)

(52) U.S. Cl.
CPC .... *H01L 29/1054* (2013.01); *H01L 21/02532* (2013.01); *H01L 21/02603* (2013.01);
(Continued)

(58) Field of Classification Search
None
See application file for complete search history.

(56) References Cited

U.S. PATENT DOCUMENTS

| 7,902,541 B2 | 3/2011 | Sekaric et al. |
| 8,492,208 B1 | 7/2013 | Cohen et al. |
(Continued)

FOREIGN PATENT DOCUMENTS

| CN | 101859770 | 10/2010 |
| JP | 2010245514 | 10/2010 |
(Continued)

OTHER PUBLICATIONS

International Preliminary Report on Patentability from PCT/US2011/067236 dated Jul. 3, 2014, 8 pgs.
(Continued)

*Primary Examiner* — Bradley K Smith
(74) *Attorney, Agent, or Firm* — Schwabe, Williamson & Wyatt P.C.

(57) ABSTRACT

Uniaxially strained nanowire structures are described. For example, a semiconductor device includes a plurality of vertically stacked uniaxially strained nanowires disposed above a substrate. Each of the uniaxially strained nanowires includes a discrete channel region disposed in the uniaxially strained nanowire. The discrete channel region has a current flow direction along the direction of the uniaxial strain. Source and drain regions are disposed in the nanowire, on either side of the discrete channel region. A gate electrode stack completely surrounds the discrete channel regions.

20 Claims, 8 Drawing Sheets

Related U.S. Application Data continuation of application No. 13/995,913, filed as application No. PCT/US2011/067236 on Dec. 23, 2011, now Pat. No. 9,224,808.

(51) Int. Cl.

| | | |
|---|---|---|
| *H01L 29/423* | (2006.01) | |
| *H01L 29/786* | (2006.01) | |
| *H01L 29/06* | (2006.01) | |
| *H01L 29/66* | (2006.01) | |
| *H01L 29/775* | (2006.01) | |
| *H01L 21/02* | (2006.01) | |
| *H01L 29/16* | (2006.01) | |
| *H01L 29/161* | (2006.01) | |
| *H01L 29/78* | (2006.01) | |
| *H01L 21/8238* | (2006.01) | |
| *H01L 27/092* | (2006.01) | |

(52) U.S. Cl.
CPC .... *H01L 21/823807* (2013.01); *H01L 27/092* (2013.01); *H01L 29/0669* (2013.01); *H01L 29/0673* (2013.01); *H01L 29/1033* (2013.01); *H01L 29/16* (2013.01); *H01L 29/161* (2013.01); *H01L 29/42392* (2013.01); *H01L 29/66439* (2013.01); *H01L 29/66742* (2013.01); *H01L 29/66795* (2013.01); *H01L 29/775* (2013.01); *H01L 29/785* (2013.01); *H01L 29/78618* (2013.01); *H01L 29/78651* (2013.01); *H01L 29/78684* (2013.01); *H01L 29/78696* (2013.01)

(56) References Cited

U.S. PATENT DOCUMENTS

| | | | |
|---|---|---|---|
| 8,841,189 | B1 | 9/2014 | Cheng et al. |
| 9,224,808 | B2 | 12/2015 | Cea et al. |
| 9,490,320 | B2* | 11/2016 | Cea .................. H01L 29/42392 |
| 2007/0001231 | A1 | 1/2007 | Currie |
| 2007/0072335 | A1 | 3/2007 | Baik et al. |
| 2007/0176824 | A1* | 8/2007 | Stumbo .................. H01Q 3/34 342/372 |
| 2008/0121932 | A1 | 5/2008 | Ranade et al. |
| 2008/0237575 | A1 | 10/2008 | Jin et al. |
| 2009/0085027 | A1 | 4/2009 | Jin et al. |
| 2009/0090934 | A1 | 4/2009 | Tezuka et al. |
| 2010/0207208 | A1 | 8/2010 | Bedell et al. |
| 2010/0252801 | A1 | 10/2010 | Sekaric et al. |
| 2011/0233522 | A1 | 9/2011 | Cohen et al. |
| 2011/0315953 | A1 | 12/2011 | Bangsaruntip et al. |
| 2013/0277714 | A1 | 10/2013 | Le et al. |
| 2014/0034908 | A1 | 2/2014 | Bangsaruntip et al. |
| 2014/0084239 | A1 | 3/2014 | Radosavljevic et al. |
| 2014/0091279 | A1 | 4/2014 | Kachian et al. |
| 2014/0151638 | A1 | 6/2014 | Chang et al. |
| 2014/0151639 | A1 | 6/2014 | Chang et al. |
| 2014/0225065 | A1 | 8/2014 | Rachmady et al. |

FOREIGN PATENT DOCUMENTS

| | | |
|---|---|---|
| TW | 201115734 | 5/2011 |
| WO | WO-2008036681 | 3/2008 |

OTHER PUBLICATIONS

International Search Report and Written Opinion for PCT Patent Application No. PCT/US2011/067236 dated Jul. 27, 2012, 11 pgs.
Non-Final Office Action from U.S. Appl. No. 13/995,913 dated May 8, 2015, 16 pgs.
Non-Final Office Action from U.S. Appl. No. 14/948,039 dated Mar. 24, 2016, 8 pgs.
Office Action and Search Report for Taiwanese Patent Application No. 101149306, dated Jul. 9, 2015, 7 pgs.
Office Action for Chinese Patent Application No. 201180076446.7, dated Jun. 3, 2016, 12 pgs.
Hashemi, Pouya et al., "Gate-All-Around n-MOSFETs With Uni-axial Tensile Strain-Induced Performance Enhancement Scalable to Sub-10-nm Nanowire Diameter", IEEE Electron Device Letters, vol. 30, No. 4, Apr. 2009, 3 pgs.
2nd Non-Final Office Action for Chinese Patent Application No. 201180076446.7, dated Feb. 3, 2017, 3 pgs., no English translation.
Non-Final Office Action and Search Report for Taiwanese Patent Application No. 105116475 dated Feb. 14, 2017, 3 pgs., no English translation.
2nd Non-Final Office Action for Chinese Patent Application No. 201180076446.7, dated Feb. 3, 2017, 4 pgs., with English translation.

* cited by examiner

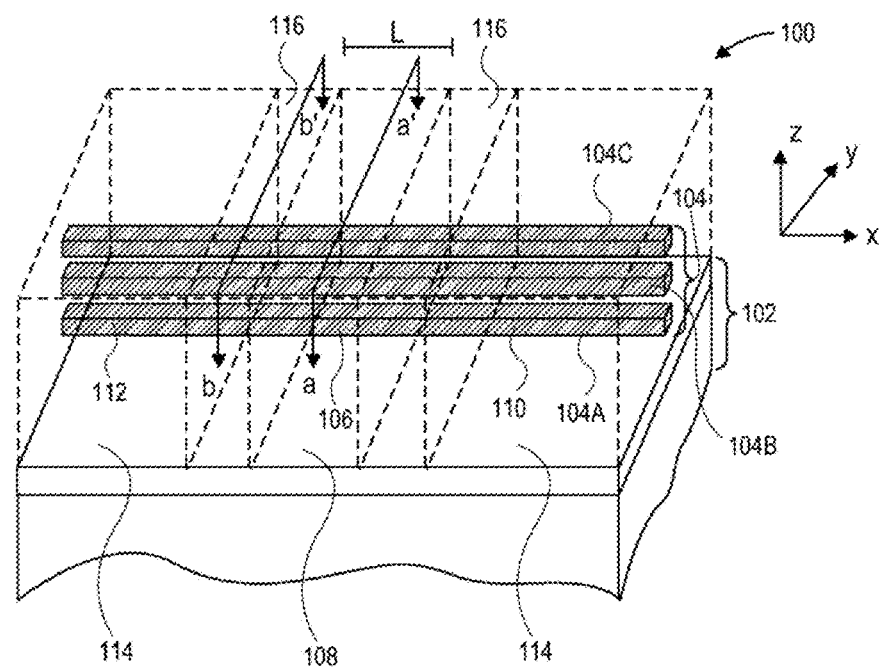
FIG. 1A
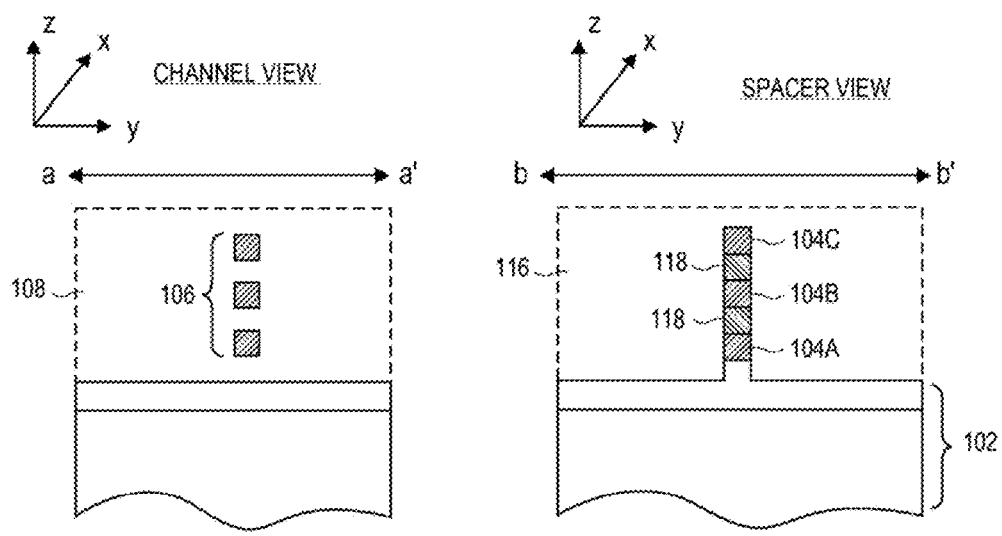
FIG. 1B  FIG. 1C

UNIAXIALLY STRAINED NANOWIRE STRUCTURE

CROSS-REFERENCE TO RELATED APPLICATIONS

This application is a continuation of U.S. patent application Ser. No. 14/948,039, filed on Nov. 20, 2015, which is a continuation of U.S. patent application Ser. No. 13/995,913, filed on Jun. 19, 2013, now U.S. Pat. No. 9,224,808, issued on Dec. 29, 2015, which is a U.S. National Phase application under 35 U.S.C. §371 of International Application No. PCT/US2011/067236, filed on Dec. 23, 2011, the entire contents of which are hereby incorporated by reference herein.

TECHNICAL FIELD

Embodiments of the invention are in the field of nanowire semiconductor devices and, in particular, uniaxially strained nanowire structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

Many different techniques have been attempted to improve the mobility of transistors. However, significant improvements are still needed in the area of electron and/or hole mobility improvement for semiconductor devices.

SUMMARY

Embodiments of the present invention include uniaxially strained nanowire structures.

In an embodiment, a semiconductor device includes a plurality of vertically stacked uniaxially strained nanowires disposed above a substrate. Each of the uniaxially strained nanowires includes a discrete channel region disposed in the uniaxially strained nanowire. The discrete channel region has a current flow direction along the direction of the uniaxial strain. Source and drain regions are disposed in the nanowire, on either side of the discrete channel region. A gate electrode stack completely surrounds the discrete channel regions.

In another embodiment, a semiconductor structure includes a first semiconductor device including a first nanowire disposed above a substrate. The first nanowire has uniaxial tensile strain and includes a discrete channel region and source and drain regions on either side of the discrete channel region. The discrete channel region has a current flow direction along the direction of the uniaxial tensile strain. The first semiconductor device also includes a first gate electrode stack completely surrounding the discrete channel region of the first nanowire. The semiconductor structure also includes a second semiconductor device including a second nanowire disposed above the substrate. The second nanowire has uniaxial compressive strain and includes a discrete channel region and source and drain regions on either side of the discrete channel region. The discrete channel region has a current flow direction along the direction of the uniaxial compressive strain. The second semiconductor device also includes a second gate electrode stack completely surrounding the discrete channel region of the second nanowire.

In another embodiment, a method of fabricating a nanowire semiconductor structure includes forming a first active layer above a substrate, the first active layer having a first lattice constant. A second active layer is formed on the first active layer, the second active layer having a second lattice constant greater than the first lattice constant. A first nanowire having uniaxial tensile strain is formed from the first active layer. The first nanowire includes a discrete channel region and source and drain regions on either side of the discrete channel region. The discrete channel region has a current flow direction along the direction of the uniaxial tensile strain. A second nanowire having uniaxial compressive strain is formed from the second active layer. The second nanowire includes a discrete channel region and source and drain regions on either side of the discrete channel region. The discrete channel region has a current flow direction along the direction of the uniaxial compressive strain. A first gate electrode stack is formed to completely surround the discrete channel region of the first nanowire. A second gate electrode stack is formed to completely surround the discrete channel region of the second nanowire.

In another embodiment, a PMOS semiconductor device includes a nanowire disposed above a substrate and having uniaxial compressive strain. The nanowire includes a discrete channel region having a current flow direction along the direction of the uniaxial compressive strain. The naowire also includes P-type source and drain regions disposed on either side of the discrete channel region. A P-type gate electrode stack completely surrounds the discrete channel region.

BRIEF DESCRIPTION OF THE DRAWINGS

FIG. 1A illustrates a three-dimensional cross-sectional view of a nanowire-based semiconductor structure, in accordance with an embodiment of the present invention.

FIG. 1B illustrates a cross-sectional channel view of the nanowire-based semiconductor structure of FIG. 1A, as taken along the a-a' axis, in accordance with an embodiment of the present invention.

FIG. 1C illustrates a cross-sectional spacer view of the nanowire-based semiconductor structure of FIG. 1A, as taken along the b-b' axis, in accordance with an embodiment of the present invention.

DETAILED DESCRIPTION

Figure 2:
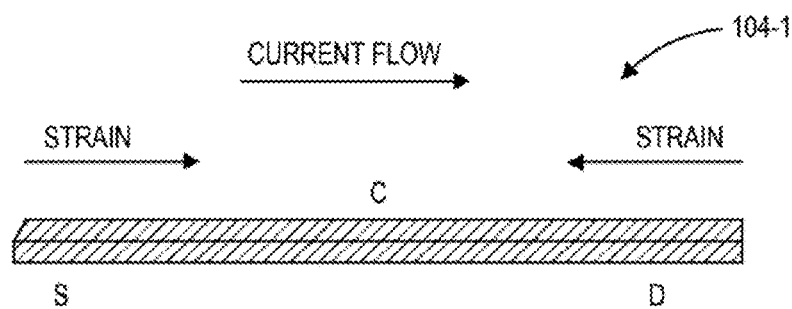
FIG. 2 illustrates an angled view of a nanowire having compressive uniaxial strain, in accordance with an embodiment of the present invention.

Uniaxially strained nanowire structures are described. In the following description, numerous specific details are set forth, such as specific nanowire integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed at improving the channel mobility for NMOS or PMOS transistors, or both. Mobility may be improved using strain, e.g., in the channel region. Thus, one or more approaches described herein provide the appropriate strain in the channel regions for both NMOS and PMOS transistors. In an embodiment, strained NMOS and PMOS nanowires are provided.

A strained silicon-on-insulator stack may be used as a starting point for fabricating nanowire-based devices having strained channel regions. For example, in one embodiment, a strained silicon layer of such a substrate is used as a first active layer. A second active layer is then formed on the first active layer using silicon germanium (SiGe) with a higher Ge % than used to fabricate the initial strained silicon-on-insulator substrate. Upon patterning the stack including the first and second active layers, the remaining portion of the SiGe layer has compressive uniaxial stress along the current flow direction of the fin, while the remaining portion of the silicon layer has tensile uniaxial stress along the current flow direction of the fin. At a replacement metal gate operation, either silicon (for PMOS devices) or SiGe (for NMOS devices) is removed from the fin stack to fabricate nanowires with a gate-all-around structure. The above approach, along with other approaches to forming strained nanowire-based devices, is described in greater detail below in association with the Figures.

For example, FIG. 1A illustrates a three-dimensional cross-sectional view of a nanowire-based semiconductor structure, in accordance with an embodiment of the present invention. FIG. 1B illustrates a cross-sectional channel view of the nanowire-based semiconductor structure of FIG. 1A, as taken along the a-a' axis. FIG. 1C illustrates a cross-sectional spacer view of the nanowire-based semiconductor structure of FIG. 1A, as taken along the b-b' axis.

Referring to FIG. 1A, a semiconductor device 100 includes one or more vertically stacked nanowires (104 set) disposed above a substrate 102. Embodiments herein are targeted at both single wire devices and multiple wire devices. As an example, a three nanowire-based device having nanowires 104A, 104B and 104C is shown for illustrative purposes. For convenience of description, nanowire 104A is used as an example where description is focused on only one of the nanowires. It is to be understood that where attributes of one nanowire are described, embodiments based on a plurality of nanowires may have the same attributes for each of the nanowires.

Each of the nanowires 104 includes a channel region 106 disposed in the nanowire. The channel region 106 has a length (L). Referring to FIG. 1B, the channel region also has a perimeter orthogonal to the length (L). Referring to both FIGS. 1A and 1B, a gate electrode stack 108 surrounds the entire perimeter of each of the channel regions 106. The gate electrode stack 108 includes a gate electrode along with a gate dielectric layer disposed between the channel region 106 and the gate electrode (not shown). The channel region 106 is discrete in that it is completely surrounded by the gate electrode stack 108 without any intervening material such as underlying substrate material or overlying channel fabrication materials. Accordingly, in embodiments having a plurality of nanowires 104, the channel regions 106 of the nanowires are also discrete relative to one another, as depicted in FIG. 1B.

Referring again to FIG. 1A, each of the nanowires 104 also includes source and drain regions 110 and 112 disposed in the nanowire on either side of the channel region 104. A pair of contacts 114 is disposed over the source/drain regions 110/112. In a specific embodiment, the pair of contacts 114 surrounds the entire perimeter of each of the source/drain regions 110/112, as depicted in FIG. 1A. That is, in an embodiment, the source/drain regions 110/112 are discrete in that they are completely surrounded by the contacts 114 without any intervening material such as underlying substrate material or overlying channel fabrication materials. Accordingly, in such an embodiment having a plurality of nanowires 104, the source/drain regions 110/112 of the nanowires are also discrete relative to one another.

Referring again to FIG. 1A, in an embodiment, the semiconductor device 100 further includes a pair of spacers 116. The spacers 116 are disposed between the gate electrode stack 108 and the pair of contacts 114. As described above, the channel regions and the source/drain regions are, in at least several embodiments, made to be discrete. However, not all regions of the nanowires 104 need be, or even can be made to be discrete. For example, referring to FIG. 1C, nanowires 104A-104C are not discrete at the location under spacers 116. In one embodiment, the stack of nanowires 104A-104C have intervening semiconductor material 118 there between, such as silicon germanium intervening between silicon nanowires, or vice versa, as described below in association with FIGS. 4A-4F. In one embodiment, the bottom nanowire 104A is still in contact with a portion of substrate 102, e.g., in contact with an insulating layer portion disposed on a bulk substrate. Thus, in an embodiment, a portion of the plurality of vertically stacked nanowires under one or both of the spacers is non-discrete.

In accordance with an embodiment of the present invention, the one or more nanowires 104 of the semiconductor device 100 are uniaxially strained nanowires. Thus, a semiconductor device may be fabricated from a single uniaxially strained nanowire (e.g., 104A) or from a plurality of vertically stacked uniaxially strained nanowires (104A-104C), as depicted in FIG. 1A. The uniaxially strained nanowire or plurality of nanowires may be uniaxially strained with tensile strain or with compressive strain. For example, FIG. 2 illustrates an angled view of a nanowire having compressive uniaxial strain, while FIG. 3 illustrates an angled view of a nanowire having tensile uniaxial strain, in accordance with one or more embodiments of the present invention.

Referring to FIG. 2, a nanowire 104-1 has a discrete channel region (C) disposed therein. A source region (S) and a drain region (D) are disposed in the nanowire 104-1, on either side of the channel region (C). The discrete channel region of the nanowire 104-1 has a current flow direction along the direction of a uniaxial compressive strain (arrows pointed toward one another), from the source region (S) to the drain region (D). In an embodiment, the uniaxially strained nanowire 104-1 having uniaxial compressive strain is composed of silicon germanium ($Si_xGe_y$, where 0<x<100, and 0<y<100). In a specific such embodiment, x is approximately 30 and y is approximately 70. In an embodiment, a PMOS semiconductor device is fabricated from the nanowire 104-1 having the uniaxial compressive strain.

Figure 3:
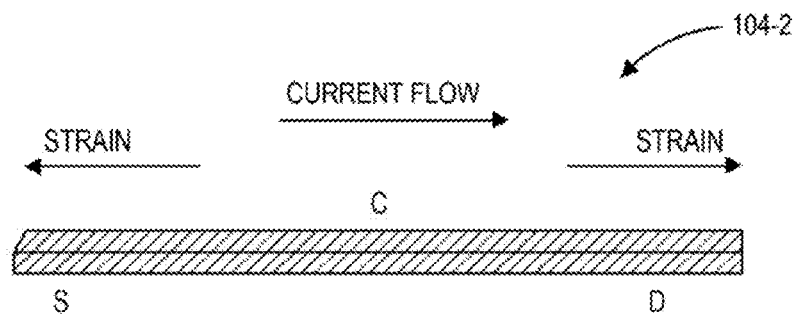
FIG. 3 illustrates an angled view of a nanowire having tensile uniaxial strain, in accordance with an embodiment of the present invention.

Referring to FIG. 3, a nanowire 104-2 has a discrete channel region (C) disposed therein. A source region (S) and a drain region (D) are disposed in the nanowire 104-2, on either side of the channel region (C). The discrete channel region of the nanowire 104-2 has a current flow direction along the direction of a uniaxial tensile strain (arrows pointed away from one another), from the source region (S) to the drain region (D). In an embodiment, the uniaxially strained nanowire 104-2 having uniaxial tensile strain is composed of silicon. In an embodiment, an NMOS semiconductor device is fabricated from the nanowire 104-2 having the uniaxial tensile strain.

Referring again to FIG. 1A, the substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 100 may be fabricated from a starting semiconductor-on-insulator substrate, such as a silicon-on-insulator (SOI) substrate or strained silicon-on-insulator (sSOI) substrate. As such, in one embodiment, the plurality of vertically stacked uniaxially strained nanowires 104 is disposed above a bulk crystalline substrate having an intervening dielectric layer disposed thereon, as depicted in FIGS. 1A-1C. Alternatively, the structure 100 is formed directly from a bulk substrate and local oxidation is used to form electrically insulative portions in place of the above described upper insulator layer. As such, in another embodiment, the plurality of vertically stacked uniaxially strained nanowires 104 is disposed above a bulk crystalline substrate having no intervening dielectric layer disposed thereon.

In an embodiment, the uniaxially strained nanowires 104 may be sized as wires or ribbons (the latter described below), and may have squared-off or rounded corners. In an embodiment, the uniaxially strained nanowires 104 are composed of a material such as, but not limited to, silicon, germanium, or a combination thereof. In one such embodiment, the uniaxially strained nanowires are single-crystalline. For example, for a uniaxially strained silicon nanowire 104, a single-crystalline nanowire may be based from a (100) global orientation, e.g., with a <100> plane in the z-direction. In an embodiment, the dimensions of the uniaxially strained nanowires 104, from a cross-sectional perspective as shown in FIG. 1B, are on the nano-scale. For example, in a specific embodiment, the smallest dimension of the uniaxially strained nanowires 104 is less than approximately 20 nanometers.

The width and height of each of the channel regions 106 is shown as approximately the same in FIG. 1B, however, they need not be. For example, in another embodiment (not shown), the width of the uniaxially strained nanowires 104 is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the uniaxially strained nanowires 104 has a width and a height, the width substantially less than the height.

In an embodiment, referring again to FIG. 1A, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 116 are composed of an insulative dielectric material such as, but not limited to, silicon dioxide, silicon oxy-nitride or silicon nitride. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material).

Although the device 100 described above is for a single device, e.g., an NMOS or a PMOS device, a CMOS architecture may also be formed to include both NMOS and PMOS nanowire-based strained channel devices disposed on or above the same substrate. For example, in accordance with another embodiment of the present invention, a semiconductor structure includes a first semiconductor device. The first semiconductor device includes a first nanowire disposed above a substrate. The first nanowire has uniaxial tensile strain and includes a discrete channel region and source and drain regions on either side of the discrete channel region. The discrete channel region has a current flow direction along the direction of the uniaxial tensile strain. A first gate electrode stack completely surrounds the discrete channel region of the first nanowire.

The CMOS semiconductor structure also includes a second semiconductor device including a second nanowire disposed above the substrate. The second nanowire has uniaxial compressive strain and includes a discrete channel region and source and drain regions on either side of the discrete channel region. The discrete channel region has a current flow direction along the direction of the uniaxial compressive strain. A second gate electrode stack completely surrounds the discrete channel region of the second nanowire.

In an embodiment, the first nanowire is composed of silicon, and the second nanowire is composed of silicon germanium ($Si_xGe_y$, where 0<x<100, and 0<y<100). In one such embodiment, the first semiconductor device is an NMOS device, and the second semiconductor device is a PMOS device. In one embodiment, x is approximately 30 and y is approximately 70. However, other stoichiometries may be selected as well, so long as they maintain strain within the layer, e.g., $Si_{40}Ge_{60}$ may be used instead. In an embodiment, the CMOS semiconductor structure may be fabricated from a starting semiconductor-on-insulator substrate. As such, in one embodiment, the first and second nanowires are disposed above a bulk crystalline substrate having an intervening dielectric layer disposed thereon.

In an embodiment, the source and drain regions of each of the first and second nanowires are discrete. Also, in one such embodiment, the first semiconductor device further includes a first pair of contacts completely surrounding the discrete source and drain regions of the first nanowire, and the second semiconductor device further includes a second pair of contacts completely surrounding the discrete source and drain regions of the second nanowire. In an embodiment, the CMOS semiconductor structure further includes a first pair of spacers disposed between the first gate electrode stack and the first pair of contacts, and a second pair of spacers disposed between the second gate electrode stack and the second pair of contacts.

In an embodiment, a portion of each of the first and second nanowires is non-discrete. In an embodiment, the first semiconductor device further includes one or more additional nanowires having uniaxial tensile strain and vertically stacked with the first nanowire. Meanwhile, the second semiconductor device further includes one or more additional nanowires having uniaxial compressive strain and vertically stacked with the second nanowire.

In another aspect, methods of fabricating a nanowire semiconductor structure are provided. For example, FIGS. 4A-4F illustrate three-dimensional cross-sectional views representing various operations in a method of fabricating a nanowire semiconductor structure, in accordance with an embodiment of the present invention.

Figure 4A:
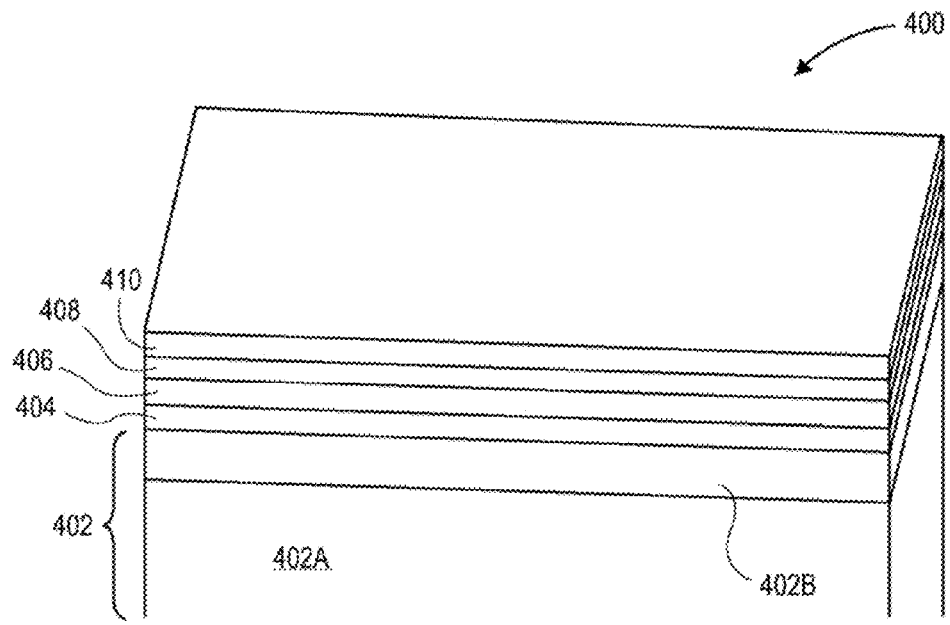
FIGS. 4A-4F illustrate three-dimensional cross-sectional views representing various operations in a method of fabricating a nanowire semiconductor structure, in accordance with an embodiment of the present invention.

A method of fabricating a nanowire semiconductor structure may, in an embodiment, include forming both a PMOS nanowire-based semiconductor device and an adjacent NMOS nanowire-based semiconductor device. Each device may be fabricated by forming a nanowire above a substrate. In a specific embodiment ultimately providing the formation of two uniaxially strained nanowires for each of the NMOS and PMOS nanowire-based semiconductor devices, FIG. 4A illustrates an initial structure 400 having a substrate 402 (e.g., composed of a bulk substrate silicon substrate 402A with an insulating silicon dioxide layer 402B there on) and a silicon layer 404/silicon germanium layer 406/silicon layer 408/silicon germanium layer 410 stack disposed thereon.

In accordance with an embodiment of the present invention, each of the silicon layer 404, the silicon germanium layer 406, the silicon layer 408, and the silicon germanium layer 410 are strained. In one such embodiment, the silicon layers 404 and 408 have tensile strain, while the silicon geranium layers 406 and 410 have compressive strain. Referring again to FIG. 4A, in an exemplary embodiment, structure 400 is provided by growing strained silicon germanium and silicon layers on a wafer of an initial strained silicon layer formed on an insulator layer atop an underlying bulk substrate (the strained silicon portion of which is layer 404). The initial structure is, in a specific embodiment, a biaxial tensile strained silicon layer on such a wafer. In a particular embodiment, the silicon layer 404 has strain equivalent to if the layer was grown on relaxed $Si_{70}Ge_{30}$, e.g., involving a "virtual substrate." Next, a $Si_{30}Ge_{70}$ layer (layer 406) is grown. The $Si_{30}Ge_{70}$ layer 406 is compressively strained with equivalent biaxial strain to 40% silicon germanium due to the delta between the strained silicon layer 404 and the $Si_{30}Ge_{70}$ lattice parameters. A second tensile strained silicon layer 408 and a second compressive strained $Si_{30}Ge_{70}$ layer 410 are then grown.

Figure 4B:
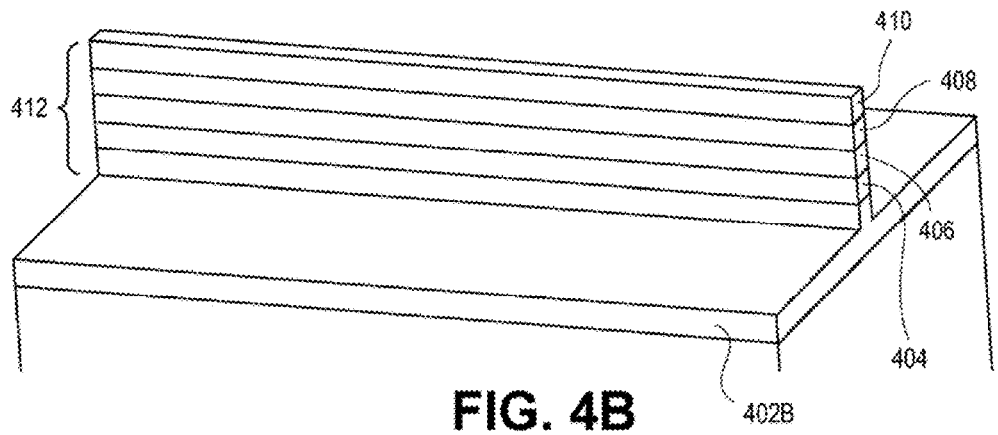

Referring to FIG. 4B, a portion of the silicon layer 404/silicon germanium layer 406/silicon layer 408/silicon germanium layer 410 stack as well as a top portion of the silicon dioxide layer 402B is patterned into a fin-type structure 412, e.g., with a mask and plasma etch process. Thus, in an embodiment, a free surface is formed on either side of each of the silicon and silicon germanium layers by patterning to provide the fin-type structure 412. In one such embodiment, the introduction of the free surfaces in the width direction reduces to some extent the biaxial stresses in the silicon and silicon germanium layers. Then, upon forming discrete nanowires (as described below in association with FIG. 4E), the biaxial stresses remaining in the silicon and silicon germanium layers are transformed to be predominately, if not all, uniaxial, as described above in association with FIGS. 2 and 3.

Figure 4C:
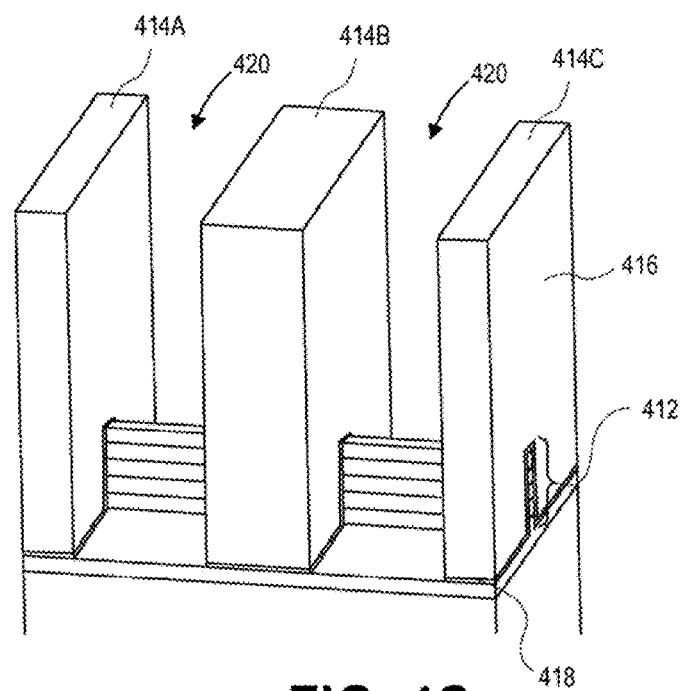

In a specific example showing the formation of three gate structures, FIG. 4C illustrates the fin-type structure 412 with three sacrificial gates 414A, 414B, and 414C disposed thereon. In one such embodiment, the three sacrificial gates 414A, 414B, and 414C are composed of a sacrificial gate oxide layer 416 and a sacrificial polysilicon gate layer 418 which are, e.g., blanket deposited and patterned with a plasma etch process.

Figure 4D:
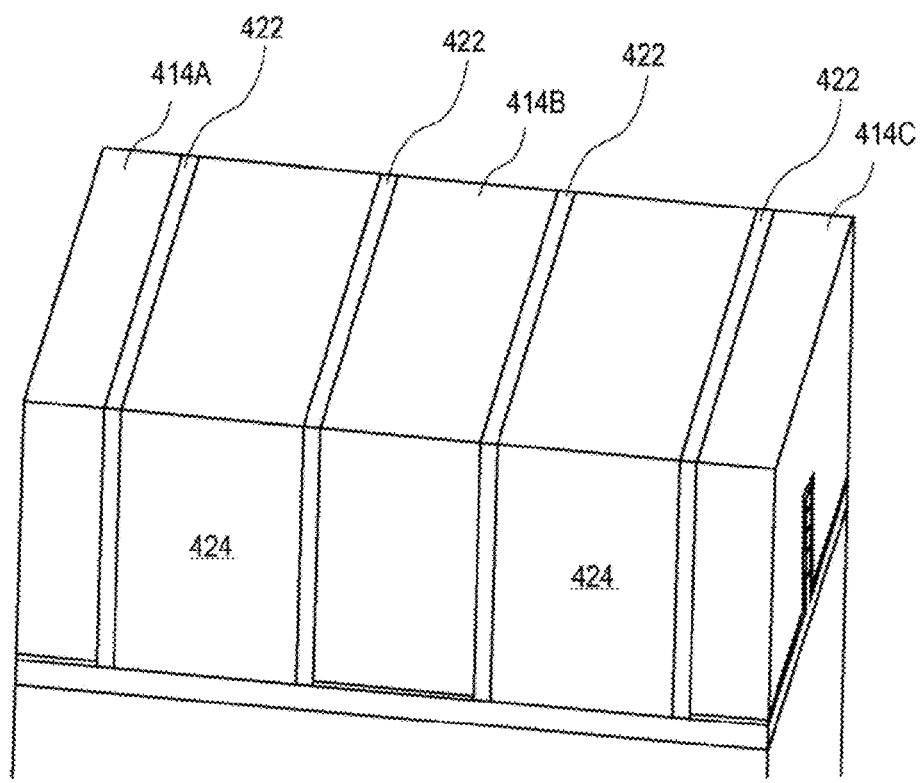

Following patterning to form the three sacrificial gates 414A, 414B, and 414C, spacers may be formed on the sidewalls of the three sacrificial gates 414A, 414B, and 414C, doping may be performed in regions 420 of the fin-type structure 412 shown in FIG. 4C (e.g., tip and/or source and drain type doping), and an interlayer dielectric layer may be formed to cover and then re-expose the three sacrificial gates 414A, 414B, and 414C. The interlayer dielectric layer may then be polished to expose the three sacrificial gates 414A, 414B, and 414C for a replacement gate, or gate-last, process. Referring to FIG. 4D, the three sacrificial gates 414A, 414B, and 414C are exposed, along with spacers 422 and interlayer dielectric layer 424.

The sacrificial gates 414A, 414B, and 414C may then be removed, e.g., in a replacement gate or gate-last process flow, to expose channel portions of the fin-type structure 412. Referring to the left-hand portion of FIG. 4E, in the case that the fin-type structure 412 is used to fabricate an NMOS device, the sacrificial gates 414A, 414B, and 414C are removed to provide trenches 426. Portions of the silicon germanium layers 406 and 410 exposed by the trenches 426, as well as exposed portions of the insulating silicon dioxide layer 402B, are removed to leave discrete portions of the silicon layers 404 and 408, e.g., to leave discrete silicon nanowires having uniaxial tensile strain.

Figure 4E:
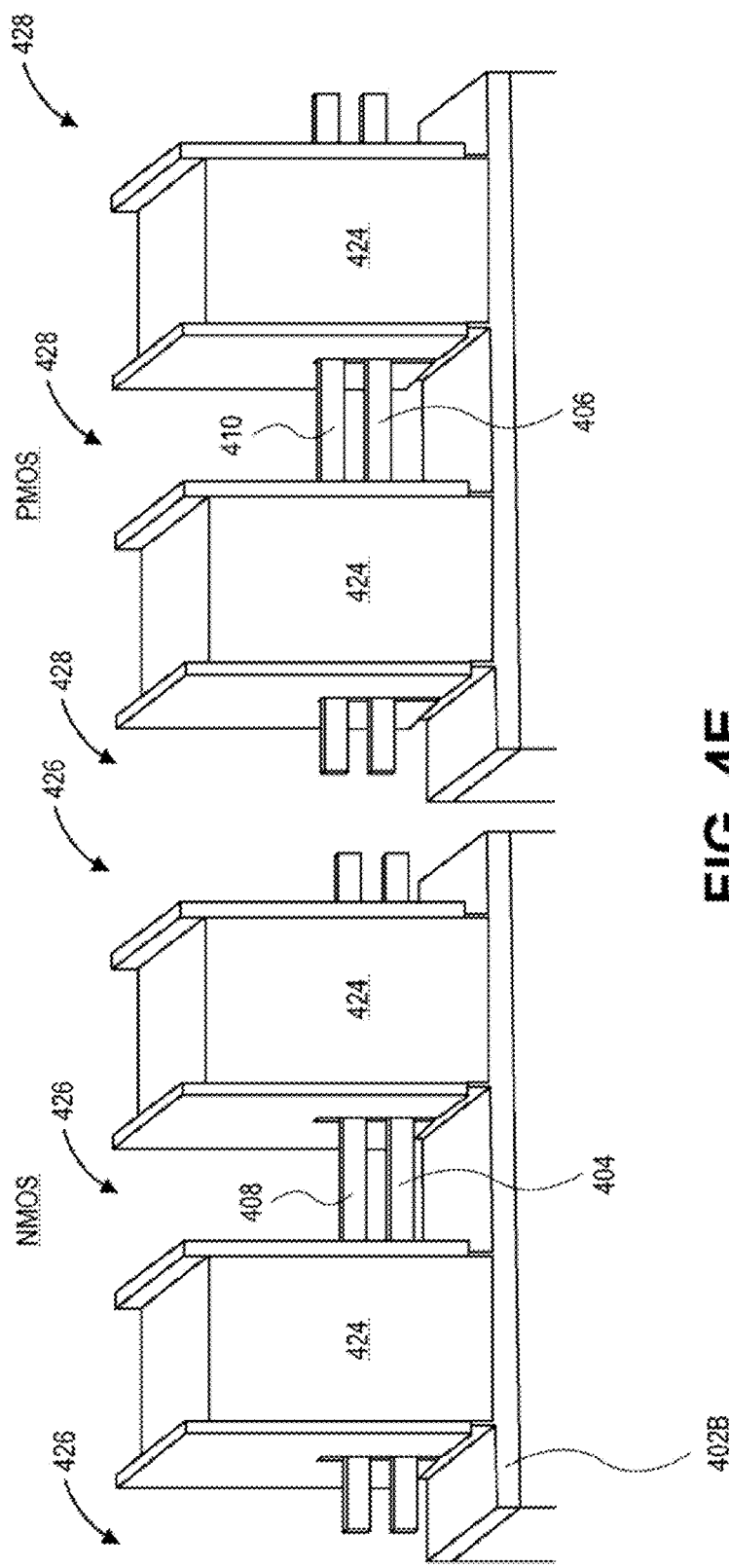

Referring to the right-hand portion of FIG. 4E, in the case that the fin-type structure 412 is used to fabricate a PMOS device, the sacrificial gates 414A, 414B, and 414C are removed to provide trenches 428. Portions of the silicon layers 404 and 408 exposed by the trenches 428 are removed to leave discrete portions of the silicon germanium layers 406 and 410, e.g., to leave discrete silicon germanium nanowires having uniaxial compressive strain.

In an embodiment, the silicon layers 404 and 408 are etched selectively with a wet etch that selectively removes the silicon 404, 408 while not etching the silicon germanium nanowire structures 406 and 410. Such etch chemistries as aqueous hydroxide chemistries, including ammonium hydroxide and potassium hydroxide, for example, may be utilized to selectively etch the silicon. In another embodiment, the silicon germanium layers 406 and 410 are etched selectively with a wet etch that selectively removes the silicon germanium while not etching the silicon nanowire structures 404 and 408. Such etch chemistries as carboxylic acid/nitric acid/HF chemistry, and citric acid/nitric acid/HF, for example, may be utilized to selectively etch the silicon germanium. Thus, either the silicon layers may be removed from the fin-type structure 412 to form silicon germanium nanowires, or the silicon germanium layers may be removed from the fin-type structure 412 to form silicon channel nanowires.

The discrete portions of the silicon layers 404 and 408 (NMOS) or the silicon germanium layers (PMOS) shown in FIG. 4E will, in one embodiment, ultimately become channel regions in a nanowire-based structure. Thus, at the process stage depicted in FIG. 4E, channel engineering or tuning may be performed. For example, in one embodiment, the discrete portions of the silicon layers 404 and 408 shown in the left-hand portion of FIG. 4E, or the discrete portions of the silicon germanium layers 406 and 410 shown in the right-hand portion of FIG. 4E, are thinned using oxidation and etch processes. Such an etch process may be performed at the same time the wires are separated by etching the opposing silicon or silicon germanium layers. Accordingly, the initial wires formed from silicon layers 404 and 408, or from silicon germanium layers 406 and 410, begin thicker and are thinned to a size suitable for a channel region in a nanowire device, independent from the sizing of the source and drain regions of the device.

Figure 4F:
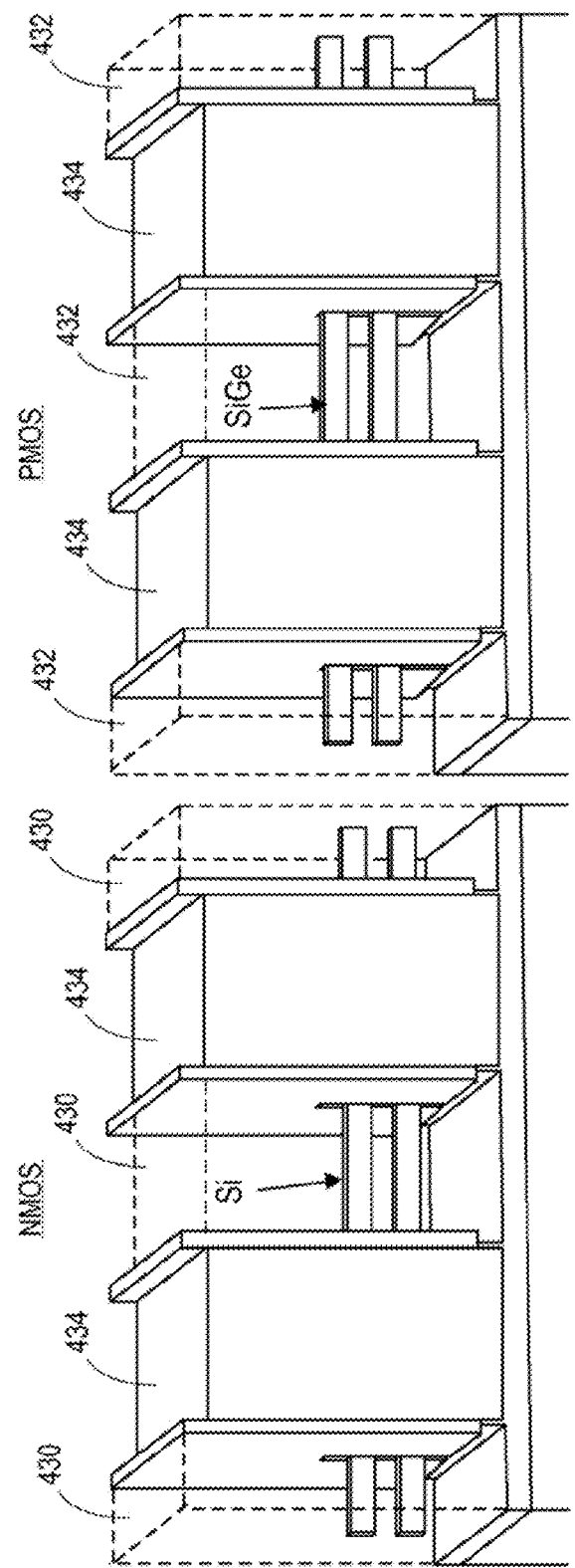

Following formation of the discrete channel regions as depicted in FIG. 4E, high-k gate dielectric and metal gate processing may be performed and source and drain contacts may be added. In the specific example showing the formation of three gate structures over two silicon nanowires (NMOS) or over two silicon germanium nanowires (PMOS), FIG. 4F illustrates the structure following deposition of an NMOS gate stack 430 or a PMOS gate stack 432. The gate stacks may be composed of a high-k gate dielectric layer and an N-type or P-type metal gate electrode layer, respectively. Additionally, FIG. 4F depicts the result of the subsequent removal of the interlayer dielectric layer 424 after formation of the permanent gate stack. Contacts may be formed in the place of the interlayer dielectric layer 424 portions remaining in FIG. 4E. In an embodiment, at some stage during the process of removing 424 and forming contacts 434, source and drain engineering may also be performed.

Thus, in perhaps more general terms, in an embodiment, a method of fabricating a nanowire semiconductor structure includes forming a first active layer above a substrate. The first active layer has a first lattice constant. A second active layer is then formed on the first active layer. The second active layer has a second lattice constant greater than the first lattice constant. In one such embodiment, the first active layer is composed of silicon, and the second active layer is composed of silicon germanium ($Si_xGe_y$, where $0<x<100$, and $0<y<100$). The number of active layers could stop here, e.g., for a CMOS structure with a single wire PMOS device and a single wire NMOS device. Alternatively, as exemplified above, additional first and second active layers may be repeated to ultimately provide multi-wire devices.

In an embodiment, the first active layer is formed above a bulk crystalline substrate having an intervening dielectric layer disposed thereon. The first active layer is formed on the intervening dielectric layer. In one such embodiment, the first active layer is composed of silicon and is formed by first forming a silicon layer on a substrate having a top approximately $Si_{70}Ge_{30}$ layer. The silicon layer is then transferred from the $Si_{70}Ge_{30}$ layer to the intervening dielectric layer. In a specific such embodiment, the second active layer is composed of approximately $Si_{30}Ge_{70}$.

The method then includes forming a first nanowire having uniaxial tensile strain from the first active layer. The first nanowire includes a discrete channel region and source and drain regions on either side of the discrete channel region. The discrete channel region has a current flow direction along the direction of the uniaxial tensile strain. A second nanowire having uniaxial compressive strain is formed from the second active layer. The second nanowire includes a discrete channel region and source and drain regions on either side of the discrete channel region. The discrete channel region has a current flow direction along the direction of the uniaxial compressive strain. In an embodiment, forming the first nanowire from the first active layer includes selectively removing a portion of the second active layer. Meanwhile, forming the second nanowire from the second active layer includes selectively removing a portion of the first active layer.

The method then includes forming a first gate electrode stack to completely surround the discrete channel region of the first nanowire. A second gate electrode stack is formed to completely surround the discrete channel region of the second nanowire. Subsequent processing operations such as contact formation and back-end interconnect formation may then be performed.

In an alternative embodiment, devices similar to the above described nanowire devices are fabricated on bulk wafers instead of silicon-on-insulator wafers. For example, FIG. 5 illustrates a three-dimensional cross-sectional view of another nanowire-based semiconductor structure, in accordance with an embodiment of the present invention.

Figure 5:
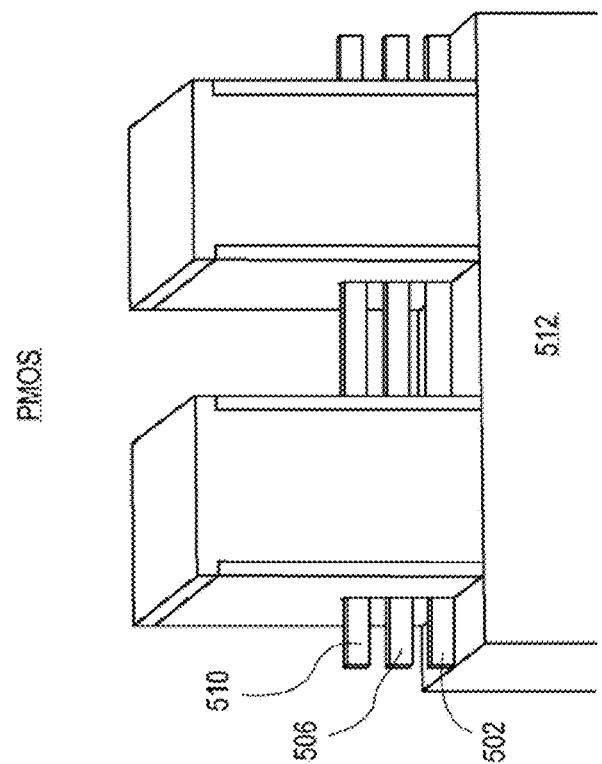
FIG. 5 illustrates a three-dimensional cross-sectional view of another nanowire-based semiconductor structure, in accordance with an embodiment of the present invention.
Figure 5:
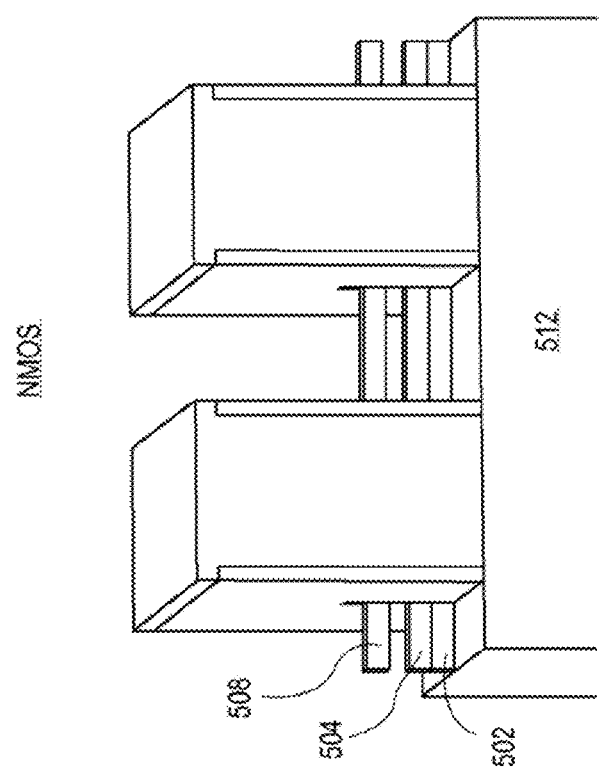

Referring to FIG. 5 a relaxed silicon germanium buffer layer 502 is used to provide a template for strained silicon layers 504 and 508 (NMOS) or strained silicon germanium layers 506 and 510 (PMOS). The substrate 512 on which the relaxed silicon germanium buffer layer 502 is isolated from the wires using either doping (e.g., such that the bottom wire is an omega-FET) or a post under fin oxidation process following fin patterning. Thus, in an embodiment, a second active layer (e.g., SiGe of a first stoichiometry) is formed on a first active layer (e.g., silicon) which is formed on a bulk crystalline substrate having a top surface layer (e.g., a buffer layer) with a lattice constant between the first and second lattice constants (e.g., a SiGe layer of a second, different stoichiometry). No intervening global dielectric layer is disposed between the first active layer and the buffer layer of the bulk substrate. In a specific embodiment, both tensile strained silicon nanowires and compressively strained silicon germanium nanowires are fabricated on relaxed silicon germanium substrates.

Accordingly, one or more embodiments of the present invention include compressive strain for improved hole mobility for PMOS nanowire-based devices and tensile strain for improved electron mobility for NMOS nanowire-based devices. In one embodiment, one or more strained silicon layers (e.g., lattice matched to relaxed $Si_{70}Ge_{30}$) and one or more strained SiGe layers are fabricated above the same substrate. In an embodiment, strained silicon and strained silicon germanium devices are formed from such layers in order to improve or maximize device performance. In an embodiment, NMOS and PMOS uniaxially strained nanowire or nanoribbon devices may be fabricated by one or more approaches described above. The PMOS transistors may include SiGe having uniaxial compressive strain along the current flow direction, while the NMOS transistors may include silicon having uniaxial tensile strain along the current flow direction.

Figure 6:
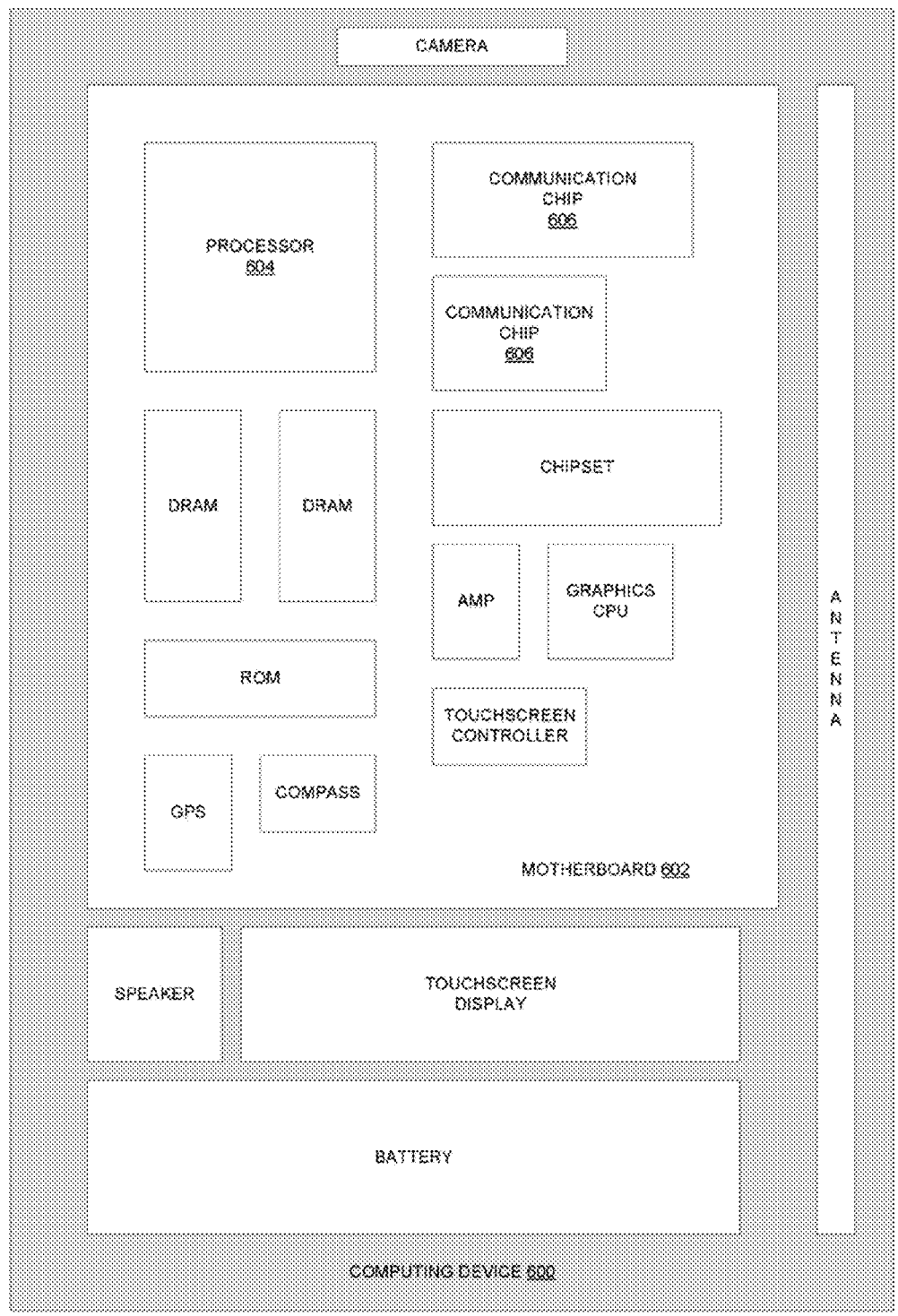
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 706 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as nanowire transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as nanowire transistors built in accordance with implementations of the invention.

In further implementations, another component housed within the computing device 600 may contain an integrated circuit die that includes one or more devices, such as nanowire transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, uniaxially strained nanowire structures have been disclosed. In an embodiment, a semiconductor device includes a plurality of vertically stacked uniaxially strained nanowires disposed above a substrate. Each of the uniaxially strained nanowires includes a discrete channel region disposed in the uniaxially strained nanowire. The discrete channel region has a current flow direction along the direction of the uniaxial strain. Source and drain regions are disposed in the nanowire, on either side of the discrete channel region. A gate electrode stack completely surrounds the discrete channel regions. In one embodiment, each of the uniaxially strained nanowires are composed of silicon and the uniaxially strain is a uniaxial tensile strain. In one embodiment, each of the uniaxially strained nanowires are composed of silicon germanium ($Si_xGe_y$, where 0<x<100, and 0<y<100) and the uniaxially strain is a uniaxial compressive strain.

What is claimed is:

1. A semiconductor structure, comprising:
   a nanowire above a substrate, the nanowire comprising:
      a discrete channel region having a first side and a second side opposite the first side, the discrete channel region having direction of uniaxial strain between the first side of the discrete channel region and the second side of the discrete channel region;
      a discrete source region adjacent to the first side of the discrete channel region; and
      a discrete drain region adjacent to the second side of the discrete channel region;
   a gate electrode completely surrounding the discrete channel region;
   a conductive source contact completely surrounding the discrete source region; and
   a conductive drain contact completely surrounding the discrete drain region.

2. The semiconductor structure of claim 1, further comprising:

a gate dielectric layer between the discrete channel region and the gate electrode.

3. The semiconductor structure of claim 2, wherein the gate dielectric layer comprises a high-k dielectric material, and wherein the gate electrode comprises a metal.

4. The semiconductor structure of claim 1, wherein the nanowire consists essentially of silicon and uniaxial strain of the discrete channel region is a uniaxial tensile strain.

5. The semiconductor structure of claim 1, wherein the nanowire consists essentially of silicon germanium ($Si_xGe_y$, where 0<x<100, and 0<y<100) and the uniaxial strain of the discrete channel region is a uniaxial compressive strain.

6. The semiconductor structure of claim 5, wherein x is approximately 30 and y is approximately 70.

7. The semiconductor structure of claim 1, wherein the nanowire is above a bulk crystalline substrate having an intervening dielectric layer thereon.

8. The semiconductor structure of claim 1, wherein the nanowire is above a bulk crystalline substrate having no intervening dielectric layer thereon.

9. The semiconductor structure of claim 1, further comprising:
a first dielectric spacer between the conductive source contact and the gate electrode; and
a second dielectric spacer between the conductive drain contact and the gate electrode.

10. The semiconductor device of claim 9, wherein a portion of the nanowire under the first and second spacers is non-discrete.

11. A method of fabricating a semiconductor structure, the method comprising:
forming a nanowire above a substrate, the nanowire comprising:
a discrete channel region having a first side and a second side opposite the first side, the discrete channel region having a direction of uniaxial strain between the first side of the discrete channel region and the second side of the discrete channel region;
a discrete source region adjacent to the first side of the discrete channel region; and
a discrete drain region adjacent to the second side of the discrete channel region;
forming a gate electrode completely surrounding the discrete channel region;
forming a conductive source contact completely surrounding the discrete source region; and
forming a conductive drain contact completely surrounding the discrete drain region.

12. The method of claim 11, further comprising:
forming a gate dielectric layer surrounding the discrete channel region, wherein forming the gate electrode comprises forming the gate electrode surrounding the gate dielectric layer.

13. The method of claim 12, wherein forming the gate dielectric layer comprises forming a high-k dielectric layer, and wherein forming the gate electrode comprises forming a metal gate electrode.

14. The method of claim 11, wherein the nanowire consists essentially of silicon and the uniaxial strain of the discrete channel region is a uniaxial tensile strain.

15. The method of claim 11, wherein the nanowire consists essentially of silicon germanium ($Si_xGe_y$, where 0<x<100, and 0<y<100) and the uniaxial strain of the discrete channel region is a uniaxial compressive strain.

16. The method of claim 15, wherein x is approximately 30 and y is approximately 70.

17. The method of claim 11, wherein the nanowire is formed above a bulk crystalline substrate having an intervening dielectric layer thereon.

18. The method of claim 11, wherein the nanowire is formed above a bulk crystalline substrate having no intervening dielectric layer thereon.

19. The method of claim 11, further comprising:
forming a first dielectric spacer at a first side of the gate electrode, wherein the conductive source contact is formed adjacent to the first dielectric spacer; and
forming a second dielectric spacer at a second side of the gate electrode opposite the first side, wherein the conductive drain contact is formed adjacent to the second dielectric spacer.

20. The method of claim 19, wherein a portion of the nanowire under the first and second spacers is non-discrete.

* * * * *